United States Patent [19]
Bouchou et al.

[11] 4,205,284
[45] May 27, 1980

[54] ELECTRICAL FREQUENCY FILTER COMPRISING PIEZOELECTRIC CRYSTALS

[75] Inventors: Paul Bouchou; Claude Nigoghossian; Guy Sillioc, all of Sartrouville, France

[73] Assignee: Compagnie D'Electronique et de Piezo-Electricite, Sartrouville, France

[21] Appl. No.: 926,115

[22] Filed: Jul. 19, 1978

[30] Foreign Application Priority Data

Jul. 22, 1977 [FR] France .................. 77 22566

[51] Int. Cl.² .................. H03H 9/26; H03H 9/32
[52] U.S. Cl. .................. 333/189; 333/190
[58] Field of Search .................. 333/190, 187–188, 333/177, 178

[56] References Cited

U.S. PATENT DOCUMENTS 2,097,458  11/1937  Hansell .................. 333/189
4,060,776  11/1977  Blinchikoff .................. 333/189

Primary Examiner—Alfred E. Smith
Assistant Examiner—Marvin Nussbaum
Attorney, Agent, or Firm—Cushman, Darby & Cushman

[57] ABSTRACT

The invention relates to electrical filters comprising piezoelectric crystals.

When very considerable variations in slope are required in the transmission curve of filters of this type, it is necessary to use a plurality of crystals having very different equivalent self-inductances, some of which are impossible to obtain. The invention overcomes these limitations by using only crystals ($X'_1$, $X'_2$, $X'_3$ ... $X'_7$) having feasible self-inductances and by establishing the desired self-inductances by using transformers such as $T_3$.

The filters according to the invention may be used in particular for the same applications as JAUMANN-type filters in telephone communications.

8 Claims, 6 Drawing Figures

Fig_1 (PRIOR ART)
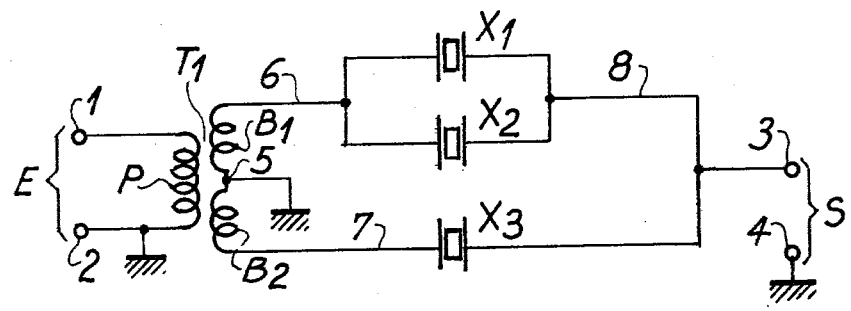
Fig_2
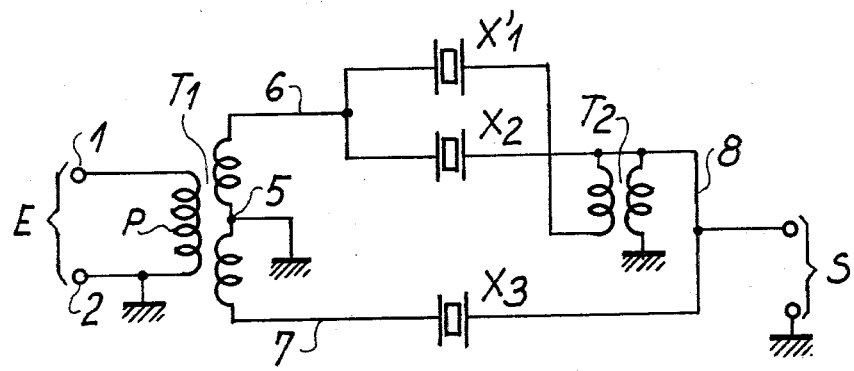
Fig_3
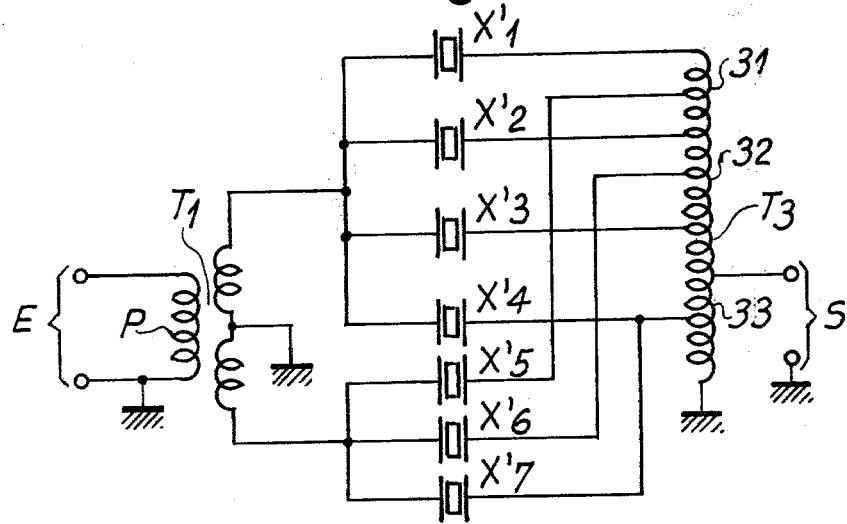

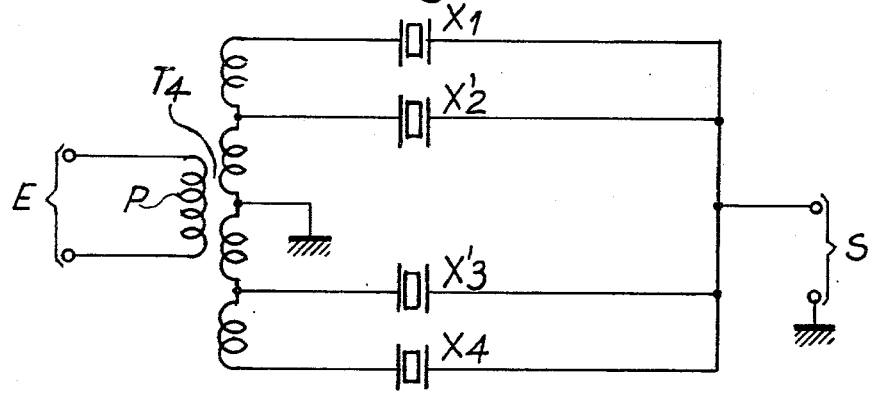
Fig_4
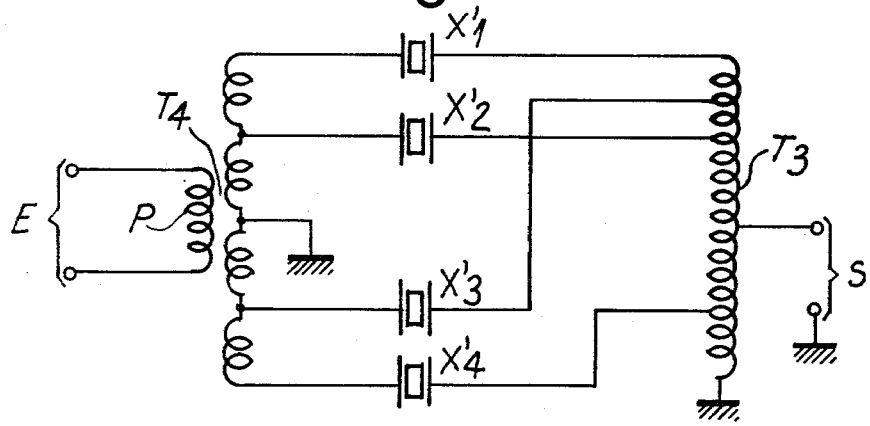
Fig_5
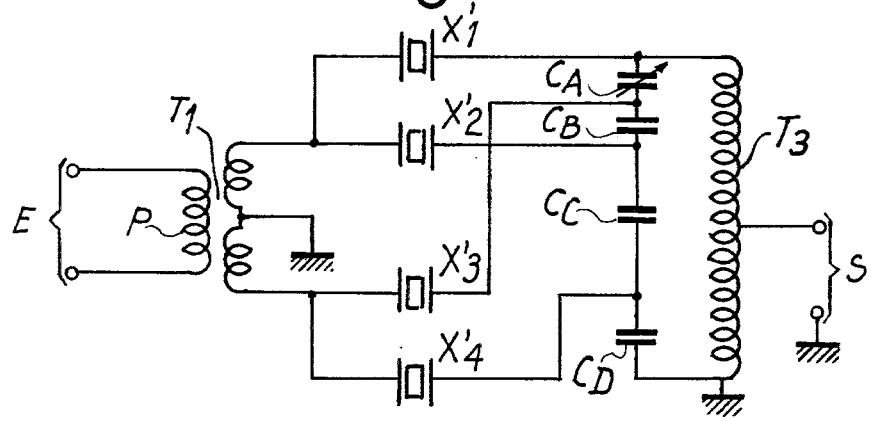
Fig_6

ELECTRICAL FREQUENCY FILTER COMPRISING PIEZOELECTRIC CRYSTALS

This invention relates to electrical circuits of the type known in the art as frequency filters. Frequency filters are quadripoles having two input terminals and two output terminals. An electrical a.c. voltage of constant value applied between the input terminals causes an a.c. voltage whose value is variable as a function of the frequency to appear at the output terminals. The filter thus shows a transmission coefficient variable as a function of frequency which is often displayed in the form of a transmission curve where the frequency is recorded on the abscissa and the ratio between the values of the voltages at the input and output ends of the filter on the ordinate. It is thus possible to transmit either only one end (upper or lower) of the frequency band or a given portion. These various possibilities correspond respectively to high-pass, low-pass and band-pass filters.

In the numerous types of known filters, use is often made of resonant tuned elements comprising either capacitors and self-induction coils or, for higher overvoltages, resonators formed by piezoelectric crystals.

A piezoelectric crystal may be considered as being equivalent to a resonant circuit of the series type formed by a capacitor and a self-induction coil in series. These elements, whose presence can only be demonstrated when the crystal is vibrating, are thus respectively known as a motional capacitance and motional self-inductance.

The application and extraction of electrical voltages appearing at certain of its parallel, opposite faces is effected by means of metallic layers deposited on those faces and their presence creates another capacitor of which the crystal forms the dielectric whose influence on the operation of the crystal as a resonator is in general negligible.

There are various ways in which these piezoelectric resonators can be cut out from the original crystals depending on the frequency bands in question, being referred to by code names such as, for example, "X-cut", "AT-cut", etc.

In the case of an AT-cut crystal of given dimensions, it is a variation in its thickness, measured according to the distance separating the faces where the metallic layers are deposited, which determines its oscillation frequency.

In the case of an X-cut crystal, of which the general form is often comparable with that of a bar, it is a variation in its length for a predetermined width which determines the oscillation frequency in the so-called elongation mode.

In addition, another characteristic value has to be taken into consideration for defining an oscillating crystal, namely its equivalent self-inductance of which the choice determines the possibility of important practical applications, as will be shown in detail hereinafter.

In the case of an AT-cut crystal, self-inductance is proportional to thickness. In the case of the X-cut, the self-inductance value is determined not only by the frequency, but also by the transverse dimensions.

However, there is an additional means for varying self-inductance for a given crystal, namely the choice of a certain surface area of the metallic layers deposited on certain faces of the crystal to act as electrodes.

This is because, for a crystal of fixed dimensions, the variation in their extent on the faces of the crystal enables the equivalent self-inductance to be varied within typical limits of the order of 3.

In the case of a crystallographic layer of the X-type for example, the value of the self-inductance coefficient L for an electrode surface A as a function of the frequency F is given by the following relation:

$$I = \frac{1.8}{A \cdot F^3}$$

where A is in cm$^2$ and F in megahertz.

Now, as will be described hereinafter, the piezoelectric crystals form the resonant elements of electrical frequency filters of which the increasing complexity means that the electrical characteristics of these crystals have to be selected over a wide range.

For example, in a large part of their field of application, the transmission curve of the filters is often desired to show sides closer to the vertical at the limits of the transmitted frequency band. To obtain this result, it is necessary to use a large number of crystals with, in addition, very different equivalent self-inductances in a typical ratio of the order of 10.

Now, it was pointed out above that in particular the self-inductance of a crystal for a given frequency depends on certain of its dimensions and on the dimensions of the conductive electrodes which it carries, and the high ratio required leads to orders of magnitude which are scarcely compatible with a rational design.

Above all for low values of the coefficient L, large dimensions of the crystals are obtained with surface areas which are virtually impossible to cover by metallisation, in addition to which the crystals show troublesome parasitic resonances.

The electrical filters according to the present invention do not have any of these disadvantages. They use a plurality of piezoelectric crystals of which the respective equivalent self-inductances have similar orders of magnitude or are limited to low ratios.

By suitably selecting the elements of the filters according to the invention, it is even possible for the plurality of crystals to be of a single type where only that dimension which determines the resonance frequency is different. In this way, the costs of production on machines are considerably reduced.

In principle, the invention makes use of transformers associated with the crystals of which the equivalent self-inductances in the filter would be difficult or impossible to obtain.

By suitably selecting the transformation ratio m, it is thus possible in each case to substitute for a crystal of self-inductance L a crystal of self-inductance L' such that these values are substantially coupled by the following relation:

$$\frac{L'}{L} = m^2$$

Although of practical use in a wide range of electrical filters, the invention may be used with particular advantage in the case of filters of the JAUMANN type corresponding to a transfer function of the CAUER-TCHEBISHEF type. Filters of this type have a structure which may be reduced to that of a plurality of crystals included in several branches of parallel circuits of which the ends are connected to input and output transformers.

It is the difficulty of producing certain of the crystals required for satisfying certain self-inductance values which normally limits the performances of these filters. By virtue of the invention, which obviates these difficulties, it is thus possible to obtain filters, for example of the CAUER-TCHEBISHEF type, which are characterised by greatly improved performance levels and lower production costs.

More precisely, the invention relates to an electrical frequency filter comprising two input terminals and two output terminals for respectively introducing and extracting an electrical a.c. voltage having a frequency comprised within given respective bands, the input terminals feeding a differential transformer of which the two windings have a common end maintained at a fixed potential, their two separate parts being connected along two arms to two pluralities of piezoelectric crystals connected in parallel, the two arms being connected by connecting means to the two output terminals, characterised in that at least one of the piezoelectric crystals is introduced into one of the arms by means of a transformer.

The invention will be better understood from the following description in conjunction with the accompanying drawings, wherein:

FIG. 1 shows a known filter of the JAUMANN type.

FIG. 2 shows a three-crystal filter of the JAUMANN type according to the invention.

FIGS. 3, 4 and 5 show variants of JAUMANN type filters according to the invention.

FIG. 6 shows another embodiment comprising capacitors.

FIG. 1 shows a known filter of the JAUMANN type. It is formed by a transformer $T_1$ comprising two coupled windings $B_1$ and $B_2$. The a.c. signal to be filtered is introduced by coupling this transformer with an input winding P of which the terminals 1 and 2 form the input terminals of the quadripole formed by the filter.

This transformer is normally known as a "differential transformer" for reasons which will be explained hereinafter.

Its two windings are connected together at one of their ends 5 of which the potential is maintained at a fixed level by connection to an "earth" or "ground".

The circuit of the filter comprises two "arms" 6 and 7 which are connected at one of their ends to the free ends of the two windings of the differential transformer and into which are introduced resonant piezoelectric crystals such as $X_1$, $X_2$, $X_3$.

These two arms are connected together at their other end by the common connection 8 which forms the output element of the filter connected to the output terminal 3 which, with the "earth" terminal 4, represents the output terminals 3 and 4 S of the quadripole filter.

A filter of this type operates as follows: when an electrical a.c. signal of increasing frequency is applied to the input terminals E, each arm shows a different variation in impedance in dependence upon the frequency of the signal applied. Now, the two arms are connected in parallel. The filter will only transmit the frequencies which, for the respective impedances of the two arms, produce values of opposite sign and different magnitude. By contrast, the frequencies which determine the equality of the magnitudes of the impedances of the two arms will cancel one another out at the output of the filter.

This justifies the designation by the name of differential transformer of the input transformer $T_1$ of which the effective function is to permit the use of differences between signals in the two arms of the filter.

It is pointed out that, although the description is confined to the case of a filter of the JAUMANN type, the invention has a much wider field of application because the majority of electrical filters known in the technical field in question, particularly the so-called "lattice filters", may be converted into equivalent filters of the JAUMANN type. It is also pointed out that the filter shown in FIG. 1 comprises only three crystals which leads to a transmission band of which the amplitude curve as a function of frequency has sides deviating considerably from the vertical. In order to obtain steeper sides, it is necessary either to multiply the filters "in cascade" with all the attendant disadvantages of complexity and price or to multiply the branches and the crystals of a filter of the JAUMANN type with very different self-inductance values which are difficult or even impossible to obtain. In general, a filter of the type in question with six quartz crystals is considered to represent a practical limit.

FIG. 2 shows a multiple-crystal frequency filter according to the invention of the same type as that shown in FIG. 1. According to the invention, one of the crystals $X_1$ of this Figure, which according to the prior art would have to have an equivalent self-inductance $L_1$ very difficult to obtain, is replaced by a crystal $X'_1$ having a self-inductance $L'_1$ easy to obtain associated with an impedance transformer $T_2$ of common ratio m. In this case, the transformation of impedance is obtained if the following relation is satisfied:

$$\frac{L_1'}{L_1} = m^2$$

By suitably selecting the orders of magnitude, it is thus possible to use two crystals $X'_1$ and $X_2$ of identical self-inductance differing only in the natural frequency of their "series" resonance. By associating the crystal $X_3$ with a transformer of suitable ratio, it is also possible in the case of the filter shown in FIG. 2 to render the three crystals identical except for their resonance frequency. This guarantees better operation of the filter as a whole coupled with lower production costs.

FIG. 3 shows a variant of the filter according to the invention comprising a total of seven piezoelectric crystals of which three are provided in one arm and four in the other arm and all of which are identical, except for their oscillation frequencies, and have a motional self-inductance of which the impedance is adjusted to the desired value for suitable operation of the filter by a plurality of matching transformers which are shown in the convenient form of windings connected in the form of an autotransformer. Accordingly, the plurality of transformers forms a single autotransformer $T_3$ with intermediate taps such as 31, 32, 33.

FIG. 4 shows a second variant of the filter according to the invention in which the impedance transformers associated with the crystals characteristic of the invention form part of the differential transformer inherent to electrical filters of the JAUMANN type.

The differential transformer $T_4$ thus performs two functions and its windings have to be established in order simultaneously to provide it with the corresponding electrical characteristics in accordance with principles of calculation which are known to the expert and which, for this reason, will not be given in the present description. The crystals $X_1$ and $X_4$ of the ends of the arms are not subjected to the impedance transformation whereas the crystals $X'_2$ and $X'_3$ are.

FIG. 5 shows a third variant of the filter according to the invention. In this variant, the two functions, namely the differential function and the impedance transforming function, have been respectively distributed between the windings of the input and output transformers, providing for increased flexibility in the choice of the self-inductances of the oscillating crystals used in the construction of the filter.

In this case, all the crystals $X'_1$, $X'_2$, $X'_3$ and $X_4'$ may be subjected to the impedance transformation characteristic of the invention.

FIG. 6 shows another embodiment of the filter according to the invention derived from the embodiment described above with reference to FIG. 3. In this embodiment, the output transformer $T_3$ is made to resonate by connecting to its terminals a capacitance of suitable value to form a tuned circuit with its own inductance. In this case, the filter has a better selectivity as a function of frequency and a higher output voltage due to the overvoltage of the tuned circuit. Although it is possible to connect the crystals to the transformer by intermediate taps, as in FIG. 3, it has been found to be of advantage, particularly for reasons of manufacturing costs, to extract the intermediate voltages at a divider bridge formed by capacitors $C_A$ $C_B$... $C_D$ which eliminates the difficulties of constructing a tapped output transformer. The precise adjustment of the division ratios may readily be obtained by providing certain capacitors with the possibility of varying their capacitance, as shown for the capacitor $C_A$.

Although the foregoing description has been confined to the case of an electrical frequency filter of the JAUMANN type, it is understood that the feature of the invention may be embodied in any other type of filter comprising a plurality of piezoelectric crystals of which the inherent self-inductances have to be selected within a wide range of values, this feature being in these filters the use of crystals having similar self-inductances, typically in a maximum ratio of 3, associated with elements for transforming the equivalent impedance of these piezoelectric crystals.

We claim:

1. An electrical frequency filter comprising two input terminals (1) (2) and two output terminals (3) (4) for respectively introducing and extracting an electrical a.c. voltage having a frequency within respective given bands, the input terminals feeding an input winding of a differential transformer ($T_1$) of which two output windings coupled to said input winding have a common terminal (5) kept at a fixed potential, their two other seperate terminals being connected along two arms (6) (7) to two pluralities of piezoelectric crystals ($X'_1$) ($X_2$) ($X_3$), the two arms being connected by connecting means (8) to the two output terminals, wherein at least one of the piezoelectric crystals ($X'_1$) is accommodated in one of the arms by means of a transformer ($T_2$).

2. An electrical filter as claimed in claim 1, wherein a plurality of crystals are accommodated by a single transformer winding with intermediate taps, each of said taps being connected to one of the crystals.

3. An electrical filter as claimed in claim 2 wherein said single transformer forms part of said differential input transformer.

4. A filter as claimed in claim 2, including a plurality of transformers divided into two portions distributed between said differential input transformer and said means for connection to the output terminals.

5. An electrical filter as claimed in claim 1, wherein said means for connection to the two output terminals comprise a plurality of capacitors connected in series to said terminals.

6. An electrical filter as claimed in claim 1 or 2 wherein at least some of the piesoelectric crystals have dimensions which are all identical, except for that dimension which determines their oscillation frequency.

7. An electrical filter as claimed in claim 1 or 2, wherein at least some of the piezoelectric crystals have self-inductances of which the values are in a ratio at most equal to 3.

8. An electrical filter as claimed in claim 1 is of the JAUMANN type.

* * * * *